(12) United States Patent
Lee et al.

(10) Patent No.: US 9,349,740 B2
(45) Date of Patent: May 24, 2016

(54) NON-VOLATILE STORAGE ELEMENT WITH SUSPENDED CHARGE STORAGE REGION

(71) Applicant: SanDisk Technologies Inc., Plano, TX (US)

(72) Inventors: Donovan Lee, Santa Clara, CA (US); Vinod R Purayath, Cupertino, CA (US); James Kai, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/163,168

(22) Filed: Jan. 24, 2014

(65) Prior Publication Data
US 2015/0214235 A1 Jul. 30, 2015

(51) Int. Cl.
| | |
|---|---|
| H01L 29/00 | (2006.01) |
| H01L 27/115 | (2006.01) |
| H01L 21/28 | (2006.01) |
| H01L 21/311 | (2006.01) |
| H01L 21/762 | (2006.01) |
| H01L 29/423 | (2006.01) |

(Continued)

(52) U.S. Cl.
CPC .... *H01L 27/11521* (2013.01); *H01L 21/28273* (2013.01); *H01L 21/31111* (2013.01); *H01L 21/76224* (2013.01); *H01L 27/11517* (2013.01); *H01L 27/11526* (2013.01); *H01L 29/42324* (2013.01); *H01L 29/6653* (2013.01); *H01L 29/6656* (2013.01); *H01L 29/7881* (2013.01)

(58) Field of Classification Search
CPC .................... H01L 29/42324; H01L 27/11517
See application file for complete search history.

(56) References Cited

U.S. PATENT DOCUMENTS

| | | | |
|---|---|---|---|
| 7,511,994 | B2 | 3/2009 | Aritome |
| 7,737,015 | B2 | 6/2010 | Kohli et al. |

(Continued)

FOREIGN PATENT DOCUMENTS

| | | |
|---|---|---|
| EP | 1418618 A2 | 5/2004 |
| EP | 1672687 A1 | 6/2006 |
| EP | 1835530 A2 | 9/2007 |

OTHER PUBLICATIONS

Ragunathan, Shyam, et al., "Investigation of Ballistic Current in Scaled Floating-gate NAND FLASH and a Solution," IEEE International Electron Devices Meeting (IEDM), Dec. 2009, pp. 34.1.1-34.14.

(Continued)

*Primary Examiner* — Ngan Ngo
(74) *Attorney, Agent, or Firm* — Vierra Magen Marcus LLP

(57) ABSTRACT

Suspended charge storage regions are utilized for non-volatile storage to decrease parasitic interferences and increase charge retention in memory devices. Charge storage regions are suspended from an overlying intermediate dielectric material. The charge storage regions include an upper surface and a lower surface that extend in the row and column directions. The upper surface of the charge storage region is coupled to the overlying intermediate dielectric material. The lower surface faces the substrate surface and is separated from the substrate surface by a void. The charge storage region includes a first vertical sidewall and a second vertical sidewall that extend in the column direction and a third vertical sidewall and fourth vertical sidewall that extend in the row direction. The first, second, third, and fourth vertical sidewall are separated from neighboring features of the non-volatile memory by the void. The void may include a vacuum, air, gas, or a liquid.

14 Claims, 14 Drawing Sheets

(51) Int. Cl.
  *H01L 29/66* (2006.01)
  *H01L 29/788* (2006.01)

(56) References Cited

U.S. PATENT DOCUMENTS

| | | | |
|---|---|---|---|
| 7,795,080 | B2 | 9/2010 | Orimoto et al. |
| 7,800,155 | B2 | 9/2010 | Matsuno |
| 7,863,190 | B1 | 1/2011 | Papasouliotis |
| 7,884,415 | B2 | 2/2011 | Nagano |
| 7,905,959 | B2 | 3/2011 | Tzu et al. |
| 8,053,347 | B2 | 11/2011 | Kang et al. |
| 8,129,264 | B2 | 3/2012 | Kim et al. |
| 8,325,529 | B2 | 12/2012 | Huang et al. |
| 8,362,542 | B2 | 1/2013 | Kang et al. |
| 8,383,479 | B2 | 2/2013 | Purayath |
| 8,492,224 | B2 | 7/2013 | Purayath et al. |
| 8,546,239 | B2 | 10/2013 | Harari et al. |
| 8,603,890 | B2 | 12/2013 | Purayath et al. |
| 2006/0194390 | A1 | 8/2006 | Imai et al. |
| 2007/0184615 | A1 | 8/2007 | Brazzelli et al. |
| 2007/0257305 | A1 | 11/2007 | Sasago et al. |
| 2008/0003743 | A1 | 1/2008 | Lee |
| 2008/0283898 | A1 | 11/2008 | Kuniya |
| 2009/0059669 | A1 | 3/2009 | Toriyama et al. |
| 2009/0127613 | A1 | 5/2009 | Ikehashi |
| 2009/0212352 | A1 | 8/2009 | Aoyama et al. |
| 2009/0267131 | A1 | 10/2009 | Nitta |
| 2010/0019311 | A1 | 1/2010 | Sato et al. |
| 2010/0127320 | A1 | 5/2010 | Nishihara et al. |
| 2010/0213548 | A1 * | 8/2010 | Chang et al. .......... 257/348 |
| 2010/0230741 | A1 | 9/2010 | Choi et al. |
| 2011/0057250 | A1 | 3/2011 | Higashi |
| 2011/0309430 | A1 | 12/2011 | Purayath et al. |
| 2012/0049245 | A1 | 3/2012 | Bicksler et al. |
| 2012/0126303 | A1 | 5/2012 | Arai et al. |
| 2012/0126306 | A1 | 5/2012 | Kawaguchi et al. |
| 2012/0178235 | A1 | 7/2012 | Pachamuthu et al. |
| 2012/0181599 | A1 * | 7/2012 | Lung .......... 257/324 |
| 2012/0276713 | A1 | 11/2012 | Miyahara et al. |
| 2015/0048437 | A1 * | 2/2015 | Ohashi et al. .......... 257/321 |
| 2015/0060986 | A1 * | 3/2015 | Fujitsuka et al. .......... 257/316 |

OTHER PUBLICATIONS

Ragunathan, Shyam, et al., "Investigation of Ballistic Current in Scaled Floating-gate NAND FLASH and a Solution," Powerpoint Presentation, IEEE International Electron Devices Meeting (IEDM), Dec. 2009, pp. 1-38.

U.S. Appl. No. 13/712,788, filed Dec. 12, 2012.

International Search RReport & The Written Opinion of the International Searching Authority dated Apr. 23, 2015, International Application No. PCT/US2015/011481.

* cited by examiner

FIG. 1
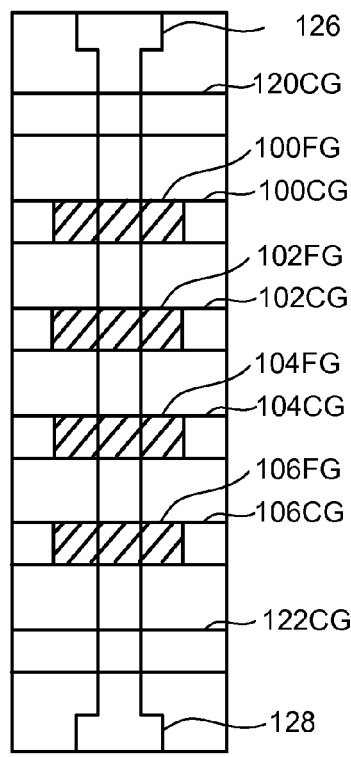
FIG. 2
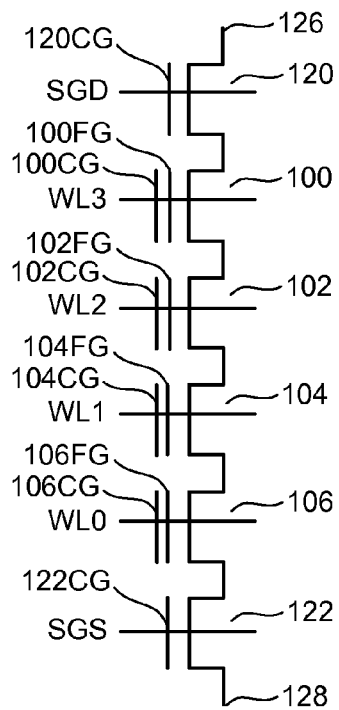
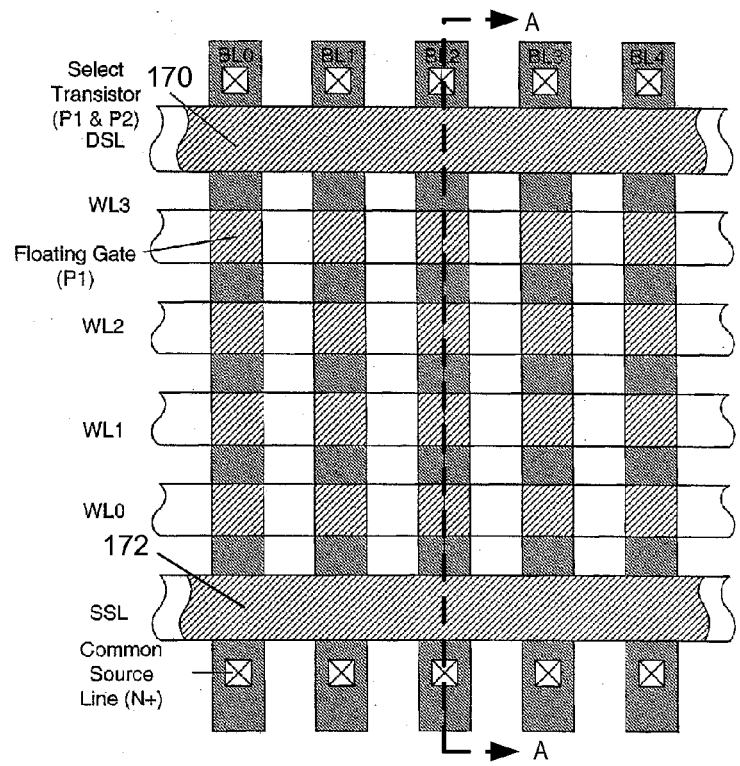
FIG. 3

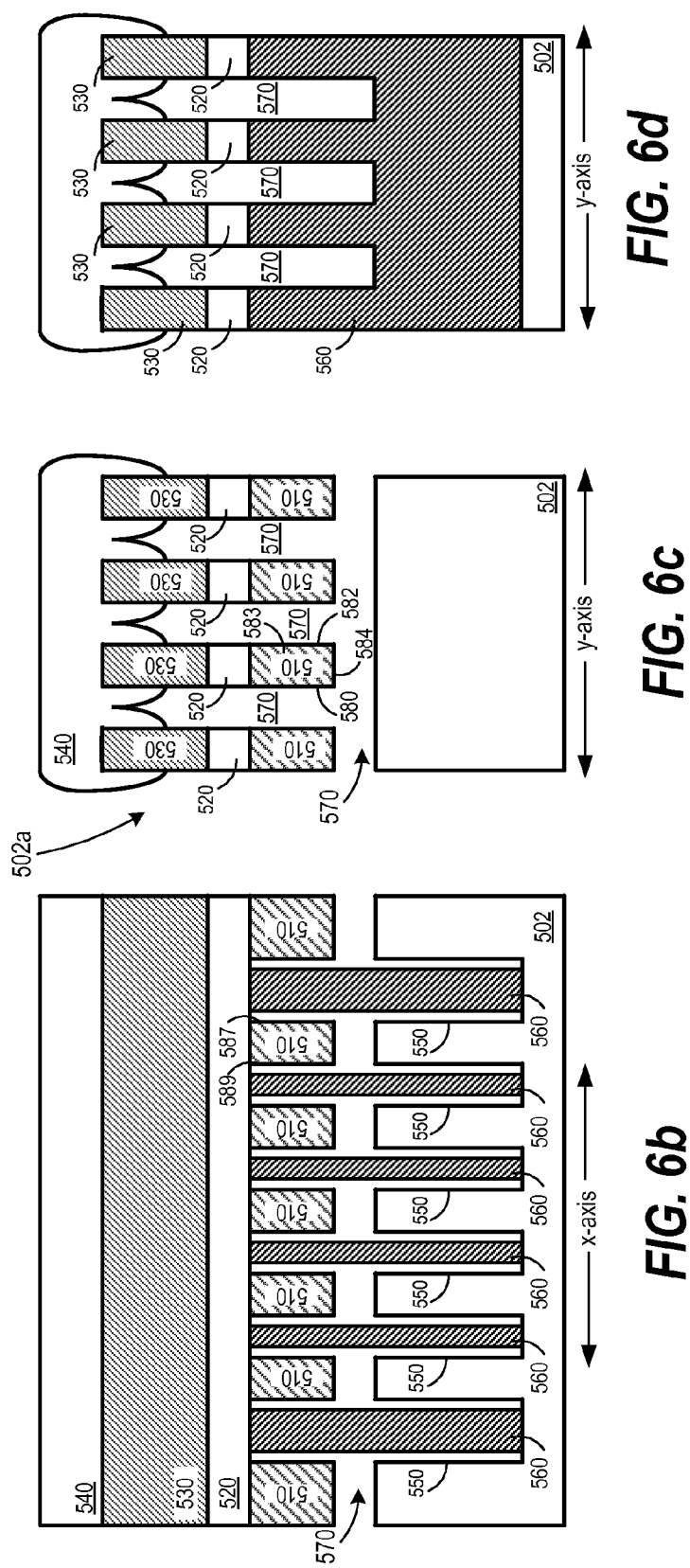

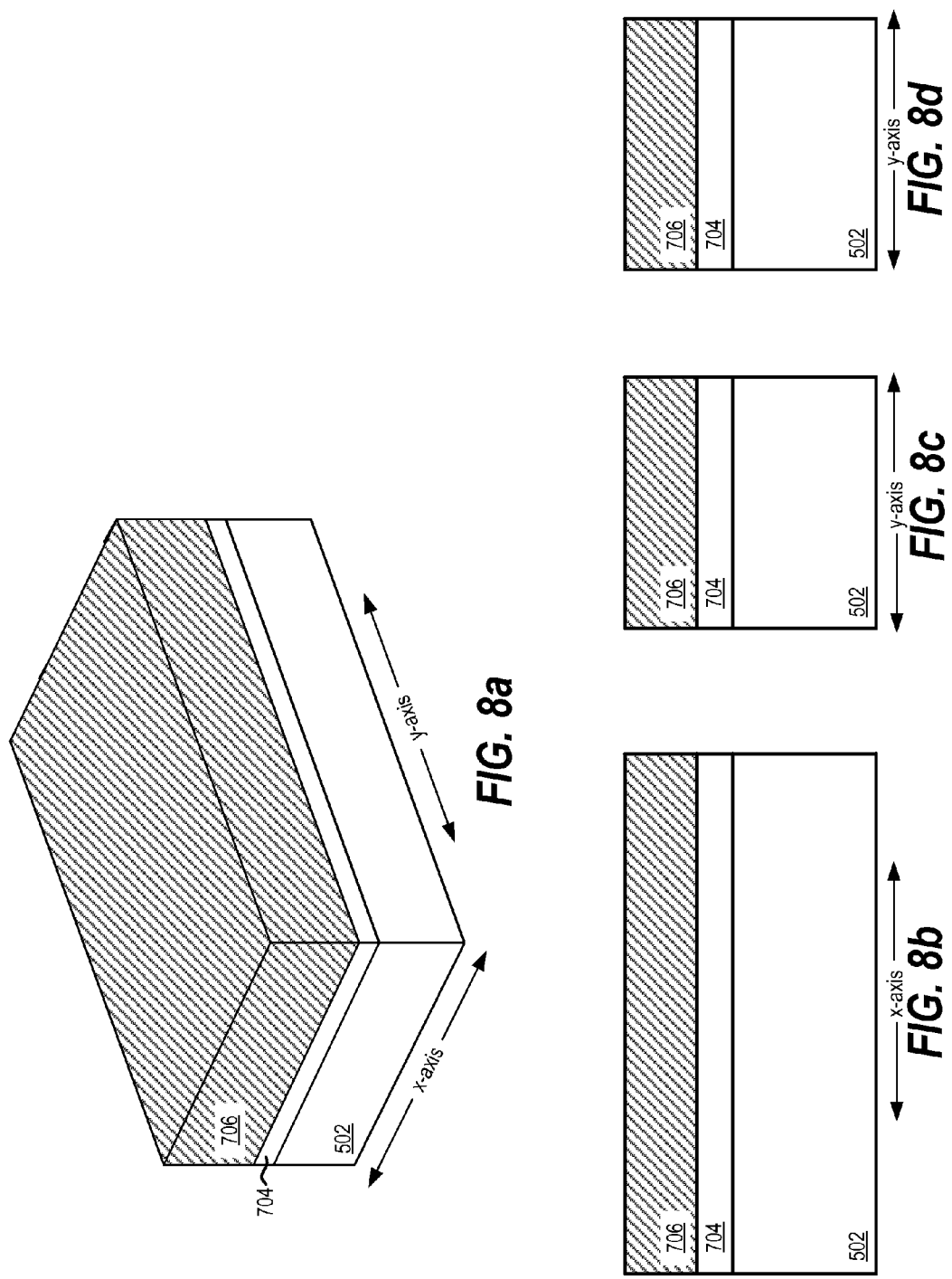

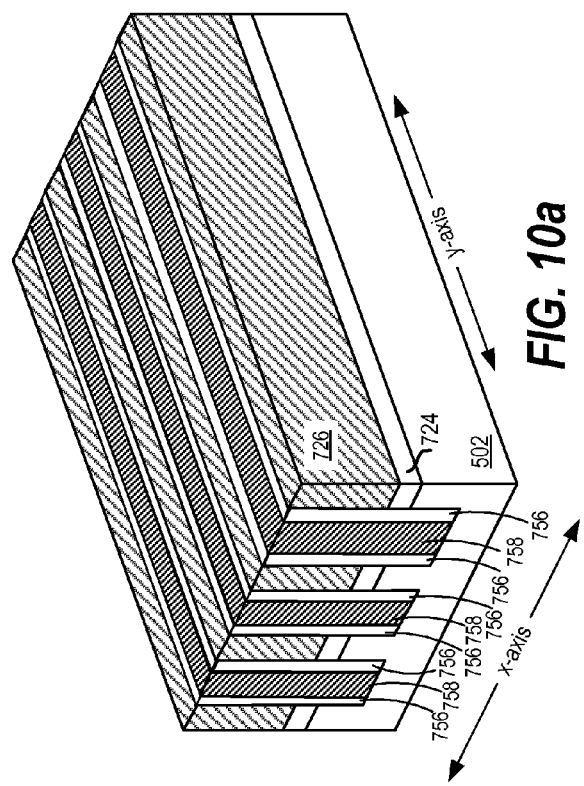
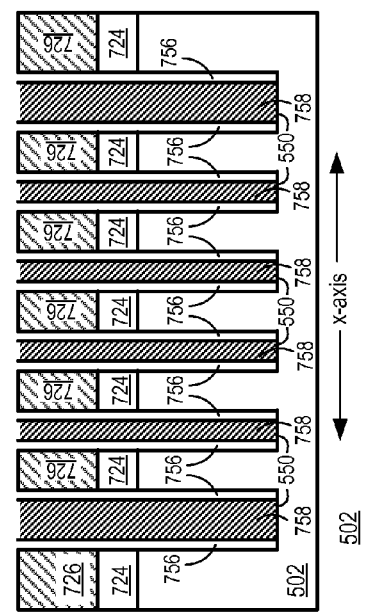
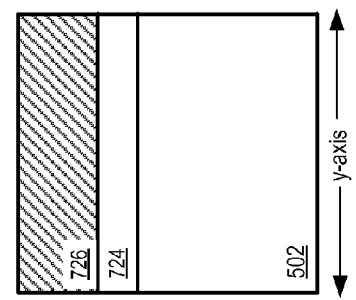
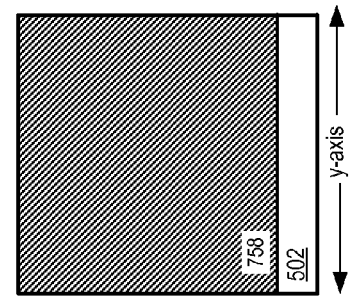
FIG. 10a
FIG. 10b
FIG. 10c
FIG. 10d

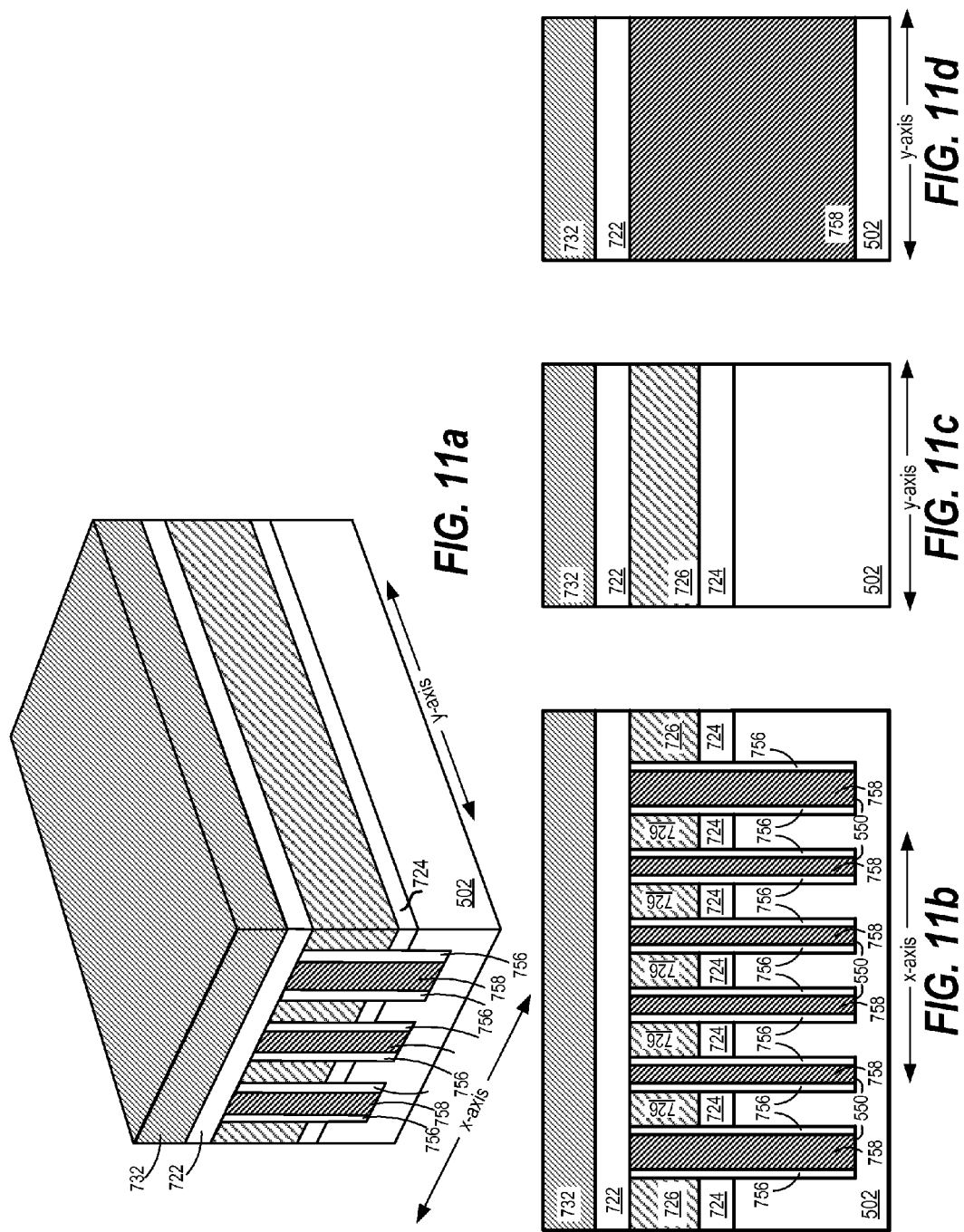

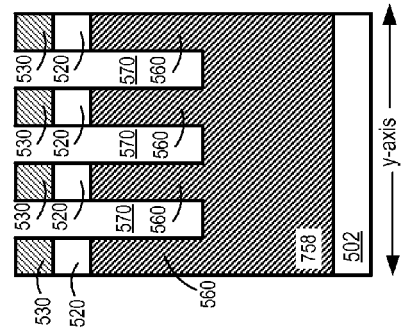
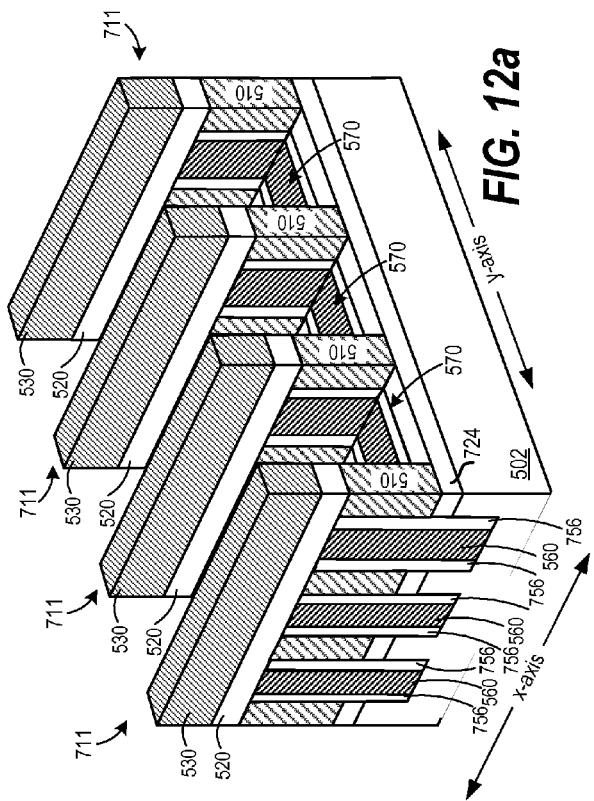
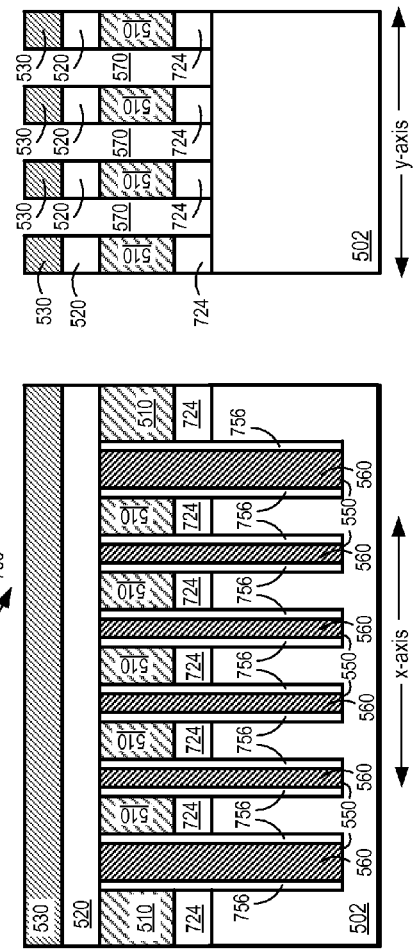
FIG. 12a
FIG. 12b
FIG. 12c
FIG. 12d

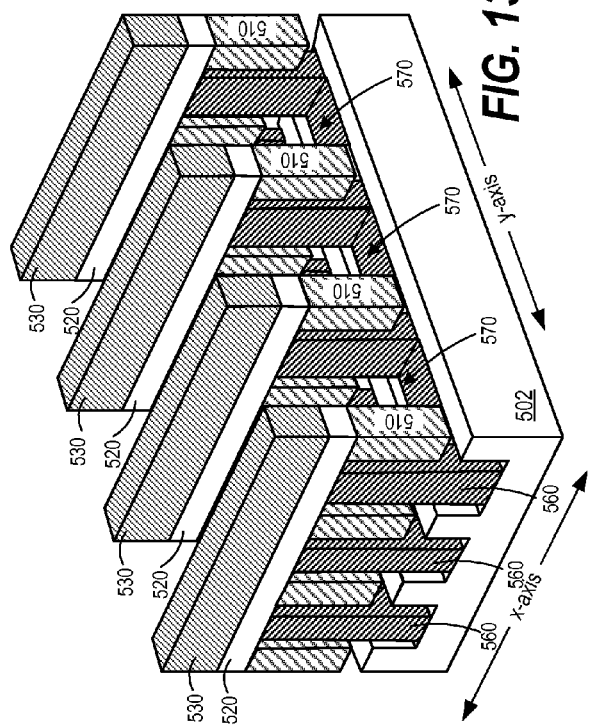
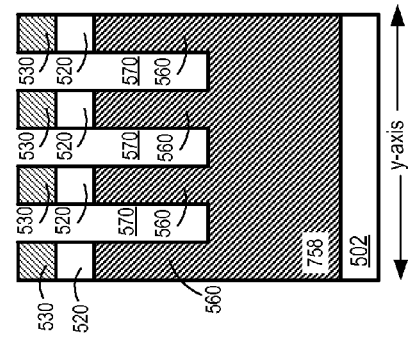
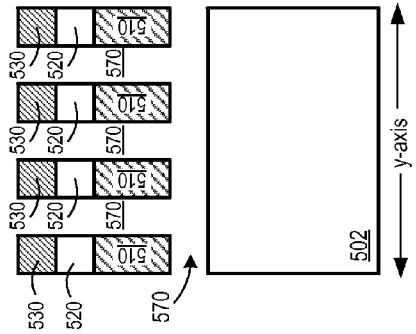
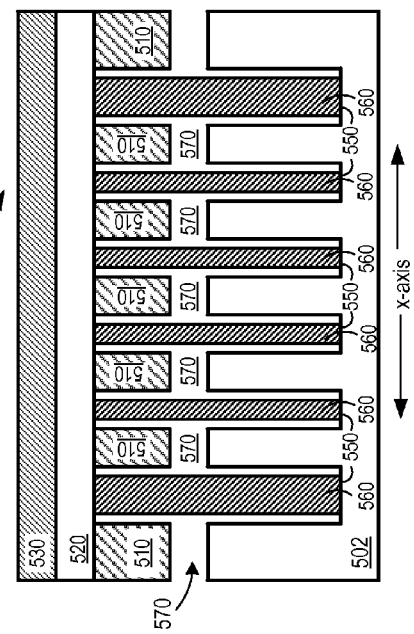

NON-VOLATILE STORAGE ELEMENT WITH SUSPENDED CHARGE STORAGE REGION

BACKGROUND OF THE INVENTION

1. Field of the Disclosure

Embodiments of the present disclosure are directed to high density semiconductor devices, such as non-volatile storage, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes.

BRIEF DESCRIPTION OF THE DRAWINGS

FIG. 1 is a top view of a NAND string.

FIG. 2 is an equivalent circuit diagram of the NAND string depicted in FIG. 1.

FIG. 3 is a plan view of a portion of a NAND flash memory array.

FIGS. 6a-6d are cross-sectional and three-dimensional views of a memory array including suspended charge storage regions in an embodiment.

FIGS. 8a-13d are cross-sectional and three-dimensional views of a portion of a non-volatile memory array that may be fabricated according to the method of FIG. 7.

DETAILED DESCRIPTION

Figure 4:
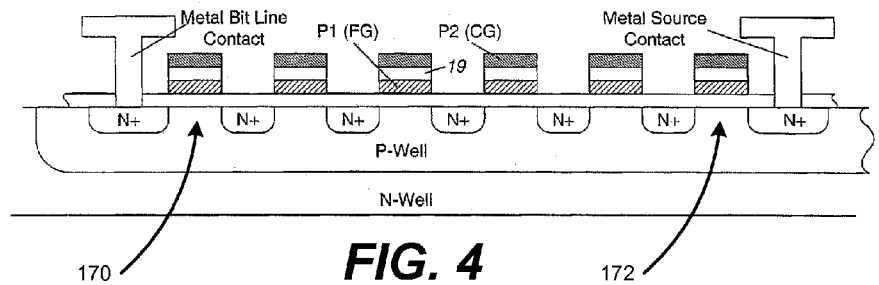
FIG. 4 is an orthogonal cross-sectional view taken along line A-A of the portion of the flash memory array depicted in FIG. 3.

An example of a NAND type of memory array is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
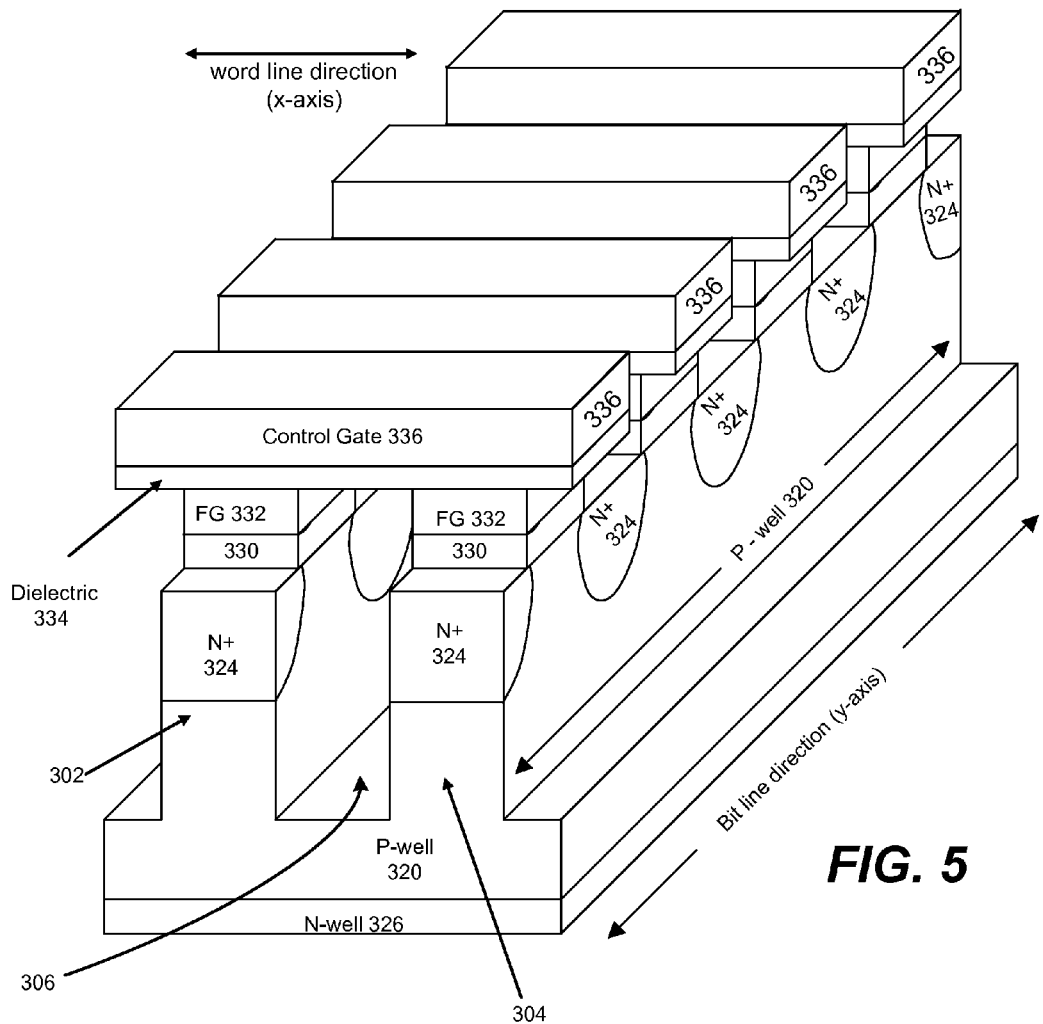
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by isolation area 306. Typically, an insulating material or dielectric is formed between adjacent NAND strings in this isolation area. In some instances, air gaps may be formed in a portion of the isolation areas.

Non-volatile memories that use floating gate and other semiconductor based charge storage regions may experience various interferences and coupling effects. For example, as charge is moved through the tunnel dielectric layer during program and erase operations, charges such as electrons may become trapped in the tunnel dielectric layer. Additionally, stress induced leakage current (SILC) damage can occur in regions surrounding a charge storage region, causing loss of stored charge from the charge storage region. Regions corresponding to the fringe fields between charge storage regions and the substrate may also experience these effects.

Coupling between adjacent charge storage regions also exists in many memories that may affect performance of the memory. For example, when electrons are stored in the floating gate of one memory cell, the stored charge may increase the apparent threshold voltage of neighboring memory cells by increasing the apparent charge stored in the floating gate. So-called floating gate to floating gate coupling may occur between floating gates of the same NAND string that are adjacent in the column direction, or between floating gates on adjacent NAND strings in the row direction. Coupling may also exist between floating gates and control gates, and floating gates and select gates, for example.

In one embodiment, suspended charge storage regions are utilized for non-volatile storage to decrease parasitic interferences between neighboring charge storage regions (e.g., floating gates), neighboring control gates and/or between neighboring floating and control gates. Suspended charge storage regions are formed by suspending the charge storage region from an overlying intermediate dielectric material in one embodiment. The charge storage regions include an upper surface and a lower surface that extend in both the row and column directions. The upper surface of the charge storage region contacts and is attached to the overlying intermediate dielectric material in one embodiment. The lower surface faces the substrate surface and is separated from the substrate surface by a void. The charge storage region includes a first vertical sidewall and a second vertical sidewall that extend in the column direction and a third vertical sidewall and fourth vertical sidewall that extend in the row direction. The first, second, third, and fourth vertical sidewall are separated from neighboring features of the non-volatile memory by the void. The void may include a vacuum, air, gas, or a liquid.

Figure 6A:
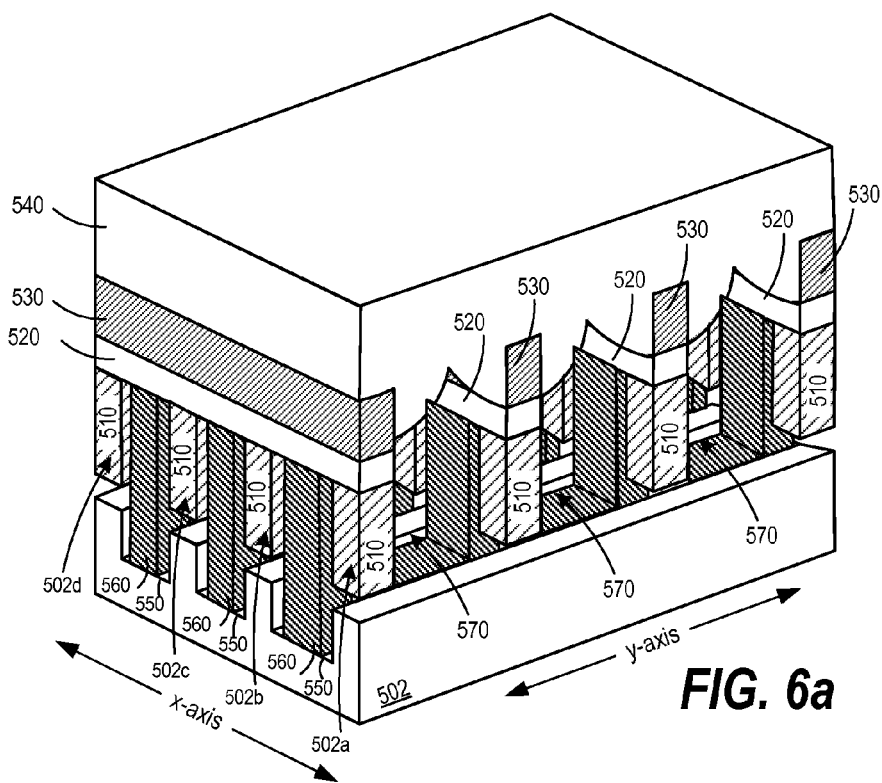

A three-dimensional view of a portion of a non-volatile memory array in accordance with an embodiment is depicted in FIG. 6a. An example is depicted that includes four NAND strings 502a, 502b, 502c, and 502d. Each NAND string includes four charge storage regions by way of example. It will be appreciated that a typical memory array will include many more NAND strings, and that each string may include any number of charge storage regions. Each NAND string overlies an active area of substrate 502. The active areas of the substrate are separated in the direction of the x-axis by isolation regions 550. A intermediate dielectric strip 520 overlies each row of charge storage regions 510. A control gate 530 overlies each row of charge storage regions and is separated from the charge storage regions by the underlying dielectric strip. Dielectric support pillars 560 are formed in portions of each isolation region to provide support for an overlying dielectric strip 520 for a row of charge storage elements.

The formation of support pillars within the isolation regions facilitates the formation of suspended charge storage regions that are separated on five sides (or surfaces) from other features of the memory array by a void 570. Each charge storage region is suspended from the overlying strip of dielectric material and is separated from adjacent features of the memory array by a void 570 in the memory array which may include a vacuum, air, gas, or a liquid. In this manner, the solid dielectric materials that typically separate each charge storage region from adjacent features are replaced with a void that does not include solid materials. Utilizing these substances or a vacuum which has a lower dielectric constant than most solid insulating materials can reduce parasitic capacitances and improve data retention.

FIG. 6b is a cross-sectional view taken along a line in the direction of the x-axis through a row of non-volatile storage elements as shown in FIG. 6a. It is noted that FIG. 6b depicts an additional column of memory cells and two additional columns of circuitry that are not depicted in FIG. 6a. These additional columns may be used for peripheral or other circuitry formation for example. In other examples, additional NAND strings will be included before the formation of any peripheral circuitry regions. FIG. 6c is a cross-sectional view taken along a line in the y-axis direction through a column of non-volatile storage elements such as NAND string 502a as shown in FIG. 6a. FIG. 6d is a cross-sectional view taken along a line in the direction of the y-axis through an isolation region such as that adjacent to NAND string 502a in FIG. 6a.

The suspended charge storage region structure is further described with reference to the second charge storage region of NAND string 502a as illustrated in FIG. 6c for example. As the combination of views illustrate, the charge storage regions are suspended and have five surfaces separated from adjacent features of the memory array by void 570. The charge storage regions 510 include a first vertical sidewall 580 (also referred to as a surface) and a second vertical sidewall 582, both of which extend in the direction of the x-axis and face the direction of the y-axis. Vertical sidewall 580 is separated from the adjacent vertical sidewall of the first charge storage region of NAND string 502a by void 570. Vertical sidewall 582 is separated from the adjacent vertical sidewall of the third charge storage region of the NAND string 502a by void 570. The lower surface 584 of the charge storage region is separated from the surface of substrate 501 by void 570. Vertical sidewall 583 extends in the direction of the y-axis and faces an adjacent charge storage region of an adjacent NAND string (not shown) or gate of an adjacent peripheral circuit column (not shown). Vertical sidewall 583 is separated from this adjacent array feature by void 570. The charge storage region also includes a vertical sidewall that is not visible in FIGS. 6a-6d. This sidewall extends in the y-direction and faces the second support pillar within the first isolation region 550. This sidewall too is separated from the support pillar 560 by void 570.

Consider the first charge storage region 510 of NAND string 502a as shown in FIG. 6b. Vertical sidewall 587 and vertical sidewall 589 extend in the y-direction similar to sidewall 583 and the not visible vertical sidewall in the y-direction of charge storage region described above. Vertical sidewall 587 is separated from the first support pillar on the right depicted in FIG. 6B by void 570. Vertical sidewall 589 is separated from the second support pillar 560 from the right in FIG. 6b by void 570.

Void 570 extends into isolation regions 550 in addition to its extent surrounding the individual charge storage regions. With reference to FIG. 6b for example, void 570 extends in the y-direction through the length of each isolation region. The void separates the dielectric support pillar in each isolation region from the vertical sidewalls of the isolation region which extend in the y-direction. Various mechanisms may be used to fabricate one or more voids 570 within a non-volatile memory array. In one embodiment, one or more sacrificial layers are used and are formed in areas corresponding to one or more target locations for void(s) 570. In one example, a first sacrificial layer is formed as part of the initial layer stack, prior to etching the layer stack to define columns for the NAND strings and the isolation regions. A second sacrificial layer is formed as sidewall spacers elongated in the y-direction within the isolation regions and extending vertically to a level at or about a level of the upper surface of the charge storage regions. The sacrificial layers can be removed after etching to define rows of non-volatile storage elements, leaving one or more voids 570. Removal of the first sacrificial layer may define a portion of the void separating the charge storage regions from the surface of the substrate. Removal of the second sacrificial layer may define a portion of the void extending in the y-direction within each isolation region and between adjacent columns of the non-volatile storage elements, as can be viewed in the depiction of FIG. 6b.

Figure 7:
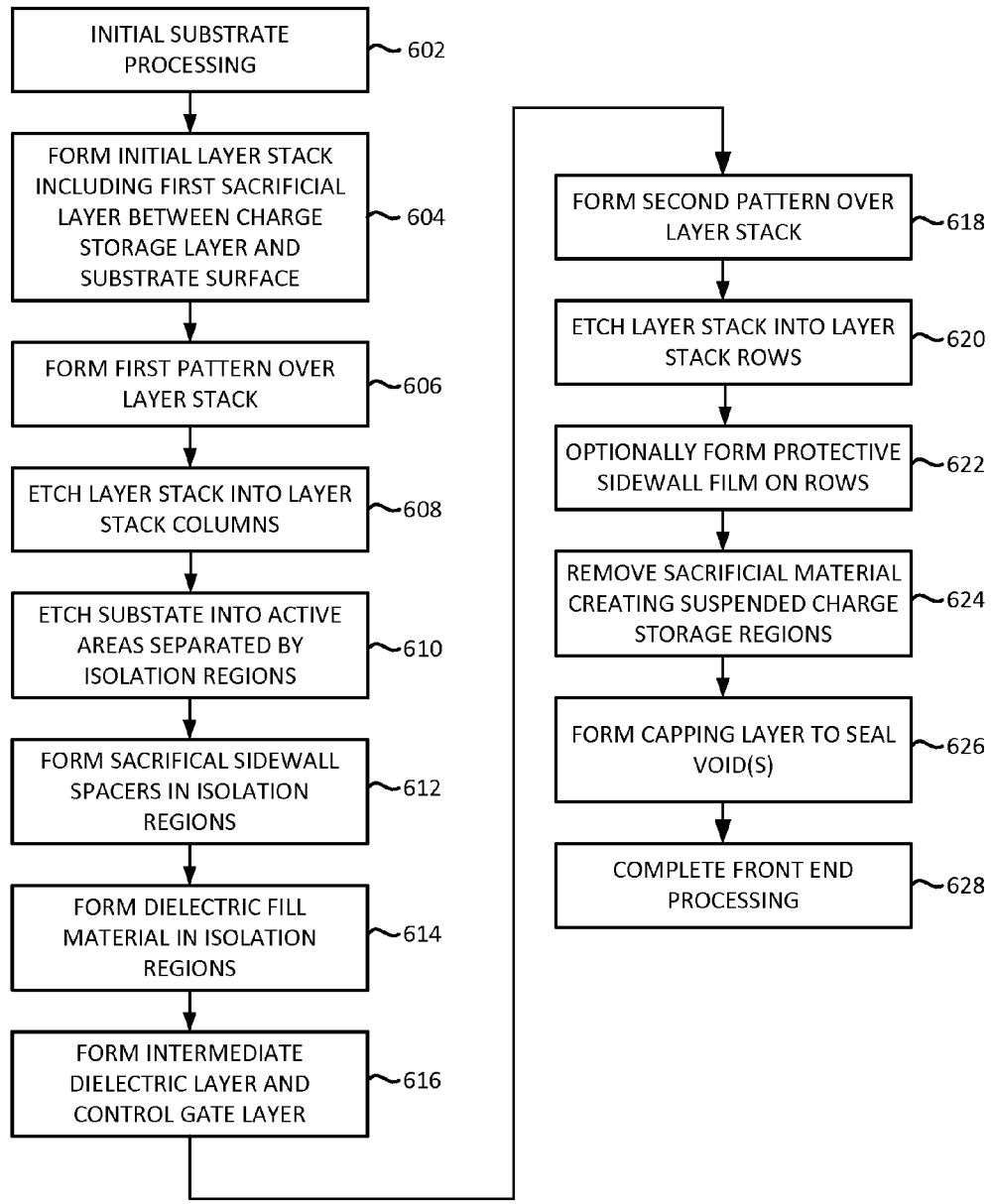
FIG. 7 is a flowchart describing a method of forming a memory array including suspended charge storage regions in an embodiment.

FIG. 7 is a flowchart describing a method of fabricating non-volatile storage with suspended charge storage regions and one or more voids in accordance with one embodiment. FIGS. 8a-13d are cross-sectional and three-dimensional views of one example of a non-volatile memory array that can be fabricated according to the method in FIG. 7. The method may be used to form a memory array as shown in FIGS. 6a-6d for example. The described embodiment is exemplary only and its precise form should not be taken as limiting the disclosure. The exact materials, dimensions and order of processing may vary according to the requirements of a given implementation. It is noted that the dimensions of the various features are not necessarily drawn to scale.

At step 602, initial processing is performed to prepare a substrate for memory fabrication. One or more wells (e.g., a triple well) are typically formed in the substrate prior to forming a layer stack over the substrate surface. For example, a p-type substrate may be used. Within the p-type substrate, an n-type well may be created and within the n-type well a p-type well may be created. Various units of a memory array may be formed within individual p-type wells. The well(s) can be implanted and annealed to dope the substrate. A zero layer formation step may also precede well formation.

At step 604, an initial layer stack is formed over the substrate surface. FIGS. 8a-8d depict the results of step 604 in one example. FIG. 8a is a three-dimension view of a portion of the memory array. FIG. 8b is a cross-sectional view in the direction of the x-axis through a target area for a row of non-volatile storage elements (a view corresponding to FIG. 6b). FIG. 8c is a cross-sectional view in the direction of the y-axis through a target area for a column of non-volatile storage elements (a view corresponding to FIG. 6c). FIG. 8d is a cross-sectional view in the direction of the y-axis through a target area for an isolation region of the non-volatile memory array.

In FIGS. 8a-8d, a layer stack is formed over the surface of a substrate 502. In this example, the layer stack includes a sacrificial layer 704 and a charge storage layer (CSL) 706. It is noted that a layer may be said to be over another layer when one or more layers are between the two layers as well as when the two layers are in direct contact. Chemical vapor deposition (CVD) processes, metal organic CVD processes, physical vapor deposition (PVD) processes, atomic layer deposition (ALD) processes, or other suitable techniques can be used to form the various layers described herein except where otherwise noted.

The charge storage layer 706 is a polysilicon floating gate layer in one embodiment. The vertical dimension (with respect to the substrate surface) or thickness of the charge storage layer can vary by embodiment. In one example, the charge storage layer has a vertical dimension of 30 nm. In another example, the charge storage layer has a vertical dimension of 50-80 nm. Dielectric charge storage materials, metal and non-metal nanostructures (e.g., carbon) can also be used for the layer of charge storage material. In one embodiment, the charge storage layer is a metal layer forming a charge-trap type floating gate layer. A thin metal charge-trap type floating gate can reduce concerns with ballistic charge programming issues that may arise with conventional polysilicon floating gates. In one embodiment, a metal floating gate layer is formed to a thickness of between 10 nm and 20 nm. In another embodiment, metal thicknesses greater than 20 nm or less than 10 nm are used. In one embodiment, the metal floating gate layer is a high work function metal. In one example, the metal is ruthenium. Other metals such as titanium, tungsten, tantalum, nickel, cobalt, etc., and their alloys (e.g., TiN, WN, TaN, NiSi, CoSi, WSix) can be used Sacrificial layer 704 may include various types of materials but may generally be selected for a higher etch rate than surrounding materials, such as the support pillar material, charge storage material, etc. In one example, a spin-on dielectric polymer is formed. As described in more detail hereinafter, the sacrificial material and processes for its removal may vary by embodiment. The sacrificial material may include, without limitation, traditional dielectrics, resists, etc. For example, polynorborene with a decomposition temperature of about 440° C. can be used. In another example, polycarbonate having a decomposition temperature of about 400° C. can be used. In other examples, cross-linked polymers such as polyneopentyl methacrylate or cyclohexyl methacrylate monomer cross-linked with ethylene glycol diacrylate may be used. Other types of materials may be suitable, including in various implementations borosilicate glass (BSG) or other type of oxide, a spin-on-carbon, polysilicon, silicon nitride (SiN) or an undensified polysilazane (PSZ) such as a PSZ-based inorganic spin-on-glass (SOG) material. A WVG curing process may be used in one example. In one example, the etch selectivity of the sacrificial film is achieved by skipping anneals. The sacrificial material may be formed using a flowable chemical vapor deposition process. Using flowable chemical vapor deposition permits the formation of a material having a relatively high etch rate when compared with other processes. The flowable CVD further provides the base for a subsequent curing process to increase the etch rate of the sacrificial film above its initial formation rate. In one embodiment, the first sacrificial film is a silazane formed using a flowable CVD process.

Returning to FIG. 7, a first pattern is formed over the layer stack at step 606. The first pattern applied at step 606 corresponds to intended columns of the memory array and may be repetitive in the row or direction of the x-axis. The pattern also corresponds to intended active areas of the substrate which will be separated by isolation regions. In one embodiment, conventional photolithography using photoresist is used to pattern one or more hard mask layer(s) into a first mask including strips elongated in the direction of the y-axis with spaces between strips adjacent in the direction of the x-axis. The hard mask layer may be patterned into a first sub-pattern at the memory array area and one or more different sub-patterns at the peripheral circuitry areas to define active areas in the substrate with different dimensions in the direction of the x-axis. Spacer-assisted patterning, nano-imprint patterning, and other patterning techniques can also be used to form strips of the hard mask layer at reduced features sizes. The pattern, repetitive in the second or row direction, may define a first direction of etching to form columns of the targeted memory array.

After forming the pattern, the layer stack is etched at step 608 and the substrate is etched at step 610. The layer stack and substrate are both etched using the first pattern or mask formed in step 606. The layer stack is etched into layer stack columns. The substrate is etched into active areas which underlie the columns and isolation regions which separate the active areas. The term layer stack is used to refer to the layers formed over the substrate throughout processing. Thus, layer stack may refer to the collection of layer stack columns that result from etching the initial layer stack. In one embodiment, reactive ion etching is used with various combinational etch chemistries to etch the different layers, however, any suitable etch can be used.

Figure 9A:
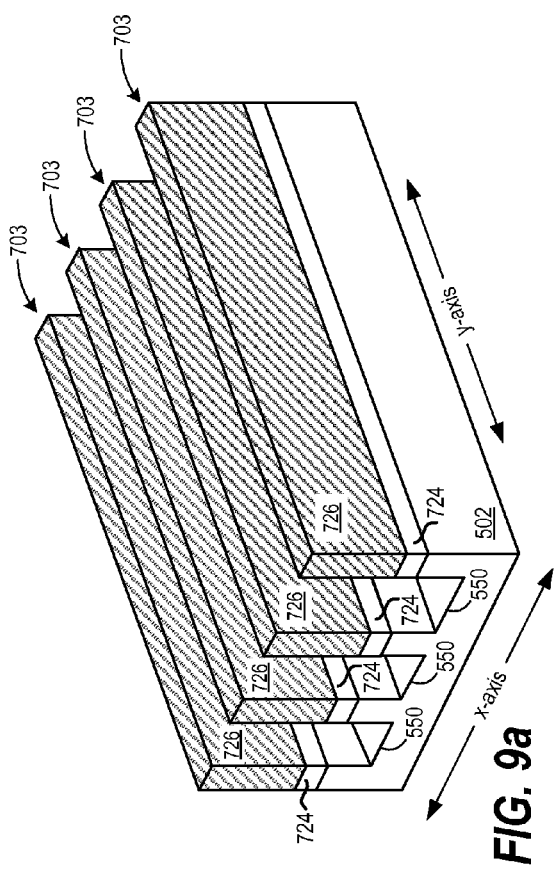
Figure 9B:
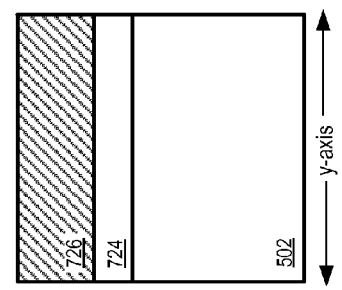
Figure 9C:
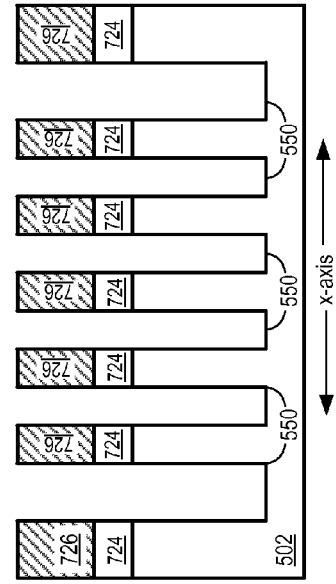
Figure 9D:
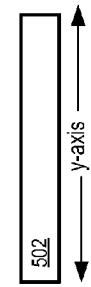

FIGS. 9a-9d depict the memory array after etching in one example. Etching forms layer stack columns 703 that are elongated in the direction of the y-axis with spaces therebetween in the direction of the x-axis. Each layer stack column 703 includes a strip 724 of sacrificial layer 704 and a strip 726 of charge storage layer 706. The substrate is etched to form isolation regions 550 and active areas that underlie the layer stack columns. In FIG. 9b, isolation regions 550 are separated by active areas of the substrate that underlie each layer stack column 703. In one example, the depth of the isolation regions in the substrate is 200 nm. Various depth can be used, for example, ranging from 150-220 nm in one embodiment.

At step 612, a second sacrificial layer is formed into sidewall spacers elongated in the y-direction along the vertical sidewalls of the isolation regions. At step 614, a dielectric fill material is formed in the remaining portions of the isolation regions and in between adjacent layer stack columns. The second sacrificial layer can be the same sacrificial material used to from the first sacrificial layer or can be a different sacrificial material. Generally, the second sacrificial material is chosen for a preferential etch selectivity with respect to other materials in the layer stack so that it may be etched at a faster rate than these materials in subsequent processes.

FIGS. 10a-10d depict the memory array after forming a second sacrificial material and a dielectric fill material in one embodiment. The sacrificial material may be formed using a conformation deposition process in one example, although other techniques can be used. After conformally depositing the sacrificial material, it may be etched back to form sacrificial spacers 756 that are elongated in the y-direction along the sidewalls of the isolation regions. The spacers further extend vertically along the sidewalls of each layer stack column in addition to the isolation region sidewalls. A dielectric fill material fills the remaining spaces in each isolation region and between adjacent layer stack columns. In FIGS. 10a-10d, the dielectric fill material has been formed and then planarized using chemical mechanical polishing, for example, to form strips 758 of the dielectric fill material that are elongated in the y-direction through each isolation region. The dielectric fill material may include any number of dielectric materials and be formed using deposition or growth processes, for example. In one example, the fill material is an insulating oxide or nitride material.

At step 616, an intermediate dielectric layer and control gate layer are formed. The intermediate dielectric layer is a triple layer of oxide, nitride and oxide (ONO) in one embodiment having a thickness of about 9-12 nm, although various materials and thicknesses may be used. In one embodiment, a high-K (dielectric constant) material is used for the intermediate dielectric to reduce or eliminate charge transfer through the intermediate layer while providing enhanced control gate to floating gate coupling. The control gate layer is polysilicon in one embodiment. The polysilicon can be doped in-situ or after formation. In another embodiment, the control gate layer is formed at least partially of a metal. In one example, the control gate layer has a lower portion that is formed from polysilicon and an upper portion that is formed from metal. A barrier layer may be formed between the polysilicon and the metal, to prevent silicidation. The control gate layer can include, by way of example (from layers to upper layers as move away from substrate surface): a barrier metal and metal; a barrier metal, polysilicon and silicide; a barrier metal and silicide (e.g., FUSI); polysilicon, a barrier metal and metal. Barrier metals may include, but are not limited to, Ti, TiN, WN and TaN or a combination with related alloys that have a suitable electron work function. Metals may include, but are not limited to, W, WSix or other similar low resistivity metals. Silicides may include, but are not limited to, NiSi, CoSi. In one example, the control gate layer is polysilicon that is subjected to silicidation after being etched into control gates so as to form a partially or fully-silicided control gate structures. The control gate layer may be formed by chemical vapor deposition (CVD), atomic layer deposition (ALD), plating, or another technique.

FIGS. 11a-11d depict the results of step 616 in one embodiment. An intermediate dielectric layer 722 is formed over the substrate followed by a control gate layer 732 that is formed over the intermediate dielectric layer. The control gate layer is formed to a depth of about 100 nm, although various thicknesses may be used.

At step 618, a second pattern is formed over the layer stack. The second pattern is formed for etching orthogonal to the direction of etching using the first pattern. The second pattern may include strips of hard masking material and/or photoresist, or other suitable mask, that are elongated in the row direction along the x-axis with a spacing between strips in the column direction along the y-axis. The pattern can be used to define the gate length for the charge storage region of each memory cell. In one example, the pattern may include strips of photoresist or another patterning agent formed over the control gate layer. One or more hard masking layers may be formed over the control gate layer before forming the strips. In one embodiment, the strips correspond to intended column dimensions for the control gates and charge storage regions. In another example, the strips may be used to form spacers for a double patterning process. Etching according to the second pattern will be used to define the gate length of the charge storage regions and select gate regions extending in the column or bit line direction. One pattern may be used for the cell area, while another pattern may be used at ae select gate area and/or peripheral circuitry area. The pattern may include wider (larger dimension in the column direction) strips at the select gate and peripheral circuitry areas to form larger gate lengths.

At step 620, the layer stack is etched into layer stack rows using the pattern formed at step 618. FIGS. 12a-12d depict the results of step 620 after etching according to the second pattern in one example. Etching continues until reaching the sacrificial strips 724 in this example. In other examples, etching may continue until reaching the substrate surface. Etching forms layer stack rows 711. The control gate layer 732 is etched into control gates (CG) 530. In one embodiment, the control gates 730 form word lines. The intermediate dielectric layer 722 is etched into intermediate dielectric strips 520. The charge storage strips 724 are etched into individual charge storage regions (e.g., floating gates) 510. The dielectric fill material 758 is also etched between adjacent layer stack rows. Etching the dielectric fill material forms pillars 560 of material 758 that extend from the bottom surface of the isolation region to the lower surface of the overlying intermediate dielectric strip 520. It is noted that a solid portion or strip of material 758 may remain in the isolation region that extends through the region in the direction of the y-axis.

At step 628, a protective sidewall film is optionally formed along the vertical sidewalls of the layer stack rows. Different films may be used in different implementations. In one example, an oxide can be deposited and etched back to form sidewall films along the sidewalls of the individual layer stack rows. Traditional spacer formation processes may be used. Each layer stack row will include two sidewall spacers, with one on each vertical sidewall. After protective sidewall film deposition, an implant process can be performed to create n+source/drain regions. In one embodiment, the n+source/drain regions are created by implanting n-type dopants such as arsenic or phosphorus into the p-well. Sidewall spacers will protect each layer stack row during subsequent processing steps. In one embodiment, the spacer material is chosen for its etch selectivity with respect to the sacrificial film(s). In this manner, the sacrificial film can later be removed in processes where the layer stack sidewalls are not exposed to the various etch chemistries. This will protect the sidewalls of the control gate layer and charge storage layer as well at the various dielectric layers. By etching back any liner material, the sacrificial materials remain exposed for subsequent removal.

At step 624, the sacrificial material is removed to form one or more voids in the memory array and thereby suspend the charge storage regions. A wet etch chemistry can be used in one embodiment, although other suitable reactive ion etch (RIE) processes (e.g., dry) can be used. The etch process is selective for the sacrificial films.

FIGS. 13a-13d depict the results of step 624 in one example. The strips 724 of the first sacrificial layer and the sacrificial sidewall spacers 756 formed from the second sacrificial layer are removed. The sacrificial strips 724 of each column underlying the charge storage regions are removed exposing the lower surface of each charge storage region and creating a void 770 between the charge storage regions and the substrate surface. The sacrificial spacers 756 are removed from the isolation regions 550 and the areas between layer stack column further extending the void 770 between the support pillars and the charge storage regions. The void 770 further extends into the isolation regions. The void 770 extends in the direction of the x-axis from the vertical sidewalls of the isolation regions to the vertical sidewalls of the support pillars facing the x-axis direction. Void 770 may extend over any portion or all of the memory array. Although a single void 770 is depicted in FIGS. 13a-13d, additional voids may be formed in other areas of the memory array, separated by insulating materials for example. Etching can remove the spacers from the isolation regions, beginning with material exposed by etching back the protective liner if used. A wet etch process is used in one embodiment, although other suitable etch processes can be used. The etch process is selective for the sacrificial materials so that they can be removed without removing the support pillars 560 and the sidewalls spacers on the layer stack rows. Etching also removes the sacrificial material in the isolation regions that underlies the layer stack rows. Etching may initially remove the sacrificial material from the side under the rows after etching proceeds vertically down into the isolation regions. Etching can continue behind the liner to remove portions of the sacrificial material that extend above the isolation regions and substrate surface. Some of the sacrificial material may not be removed. Thus, removing the sacrificial material does not necessarily have to include removing all of the material.

At step 626, a capping layer is formed over the memory array to seal the voids. FIGS. 6a-6d earlier described depict the results of step 626 in one example. A capping layer 540 is formed over the layer stack rows using a non-conformal deposition process in one embodiment. A dielectric liner (e.g., oxide) is formed along the sidewalls and over the layer stack rows. Capping layer 540 accumulates by using a non-conformal deposition process and meets at a location over the spaces between rows to seal the voids. In this manner, a seal for the voids that are elongated in the x-direction is created. Material 540 extends vertically toward the substrate surface along a portion of the vertical sidewalls of the layer stack rows (or a liner if used). The amount of this vertical dimension will define an upper endpoint of the voids at a lower surface of material 540. Although not shown, some portion of capping layer may enter the spaces between rows. Any accumulation will be minor and only decrease the size of the void minimally. Although not shown, a polishing step can be applied to form individual caps from layer 540. The capping layer can be polished to form plugs sealing the word line air gaps. A planar surface can be created for further processing steps. The vertical dimension (with respect to substrate surface) and row dimension (along x-axis) of the air gaps can vary to meet the particular requirements (e.g., suitable isolation parameters) of a given implementation.

At step 628, front end processing is completed. In one example, step 628 may include interconnecting the floating gate and control gate regions of select and peripheral circuitry transistors. Peripheral gate connections can be formed using vias or contact holes, etc. to form contacts to individual gate regions or to connect multiple transistors to a common control line. The select gate transistors can have their floating gate regions shorted to the control gate regions to form a single gate structure. Array connections can also be patterned and formed. After forming contacts, etc., further backend processing to form metal layers, etc. to complete the device according to known techniques can be performed. Various backend processes can be performed to finalize fabrication of the array. For example, a passivation dielectric layer can be deposited, followed by forming metal conductive lines and vias to connect the lines with source and drain regions at the end of the memory cell strings, etc.

It is noted that a non-volatile storage element having a suspended charge storage region can be operated in the same manner as traditional memory cells. It is explicitly noted that suspended charge storage regions 510 are stationary within the non-volatile memory array. That is, they occupy the same physical location within the memory array during operation and non-operation. For example, the charge storage region is not moved in order to be programmed or read. Reading, writing, and erase operations can all be performed with the charge storage regions in their suspended position. Additionally, the charge storage regions are in their suspended position during non-operation of the non-volatile memory array. The charge storage regions are not moved toward the substrate or placed in contact with the substrate or a tunnel dielectric layer in order to perform read, program, or erase operations.

Figure 14:
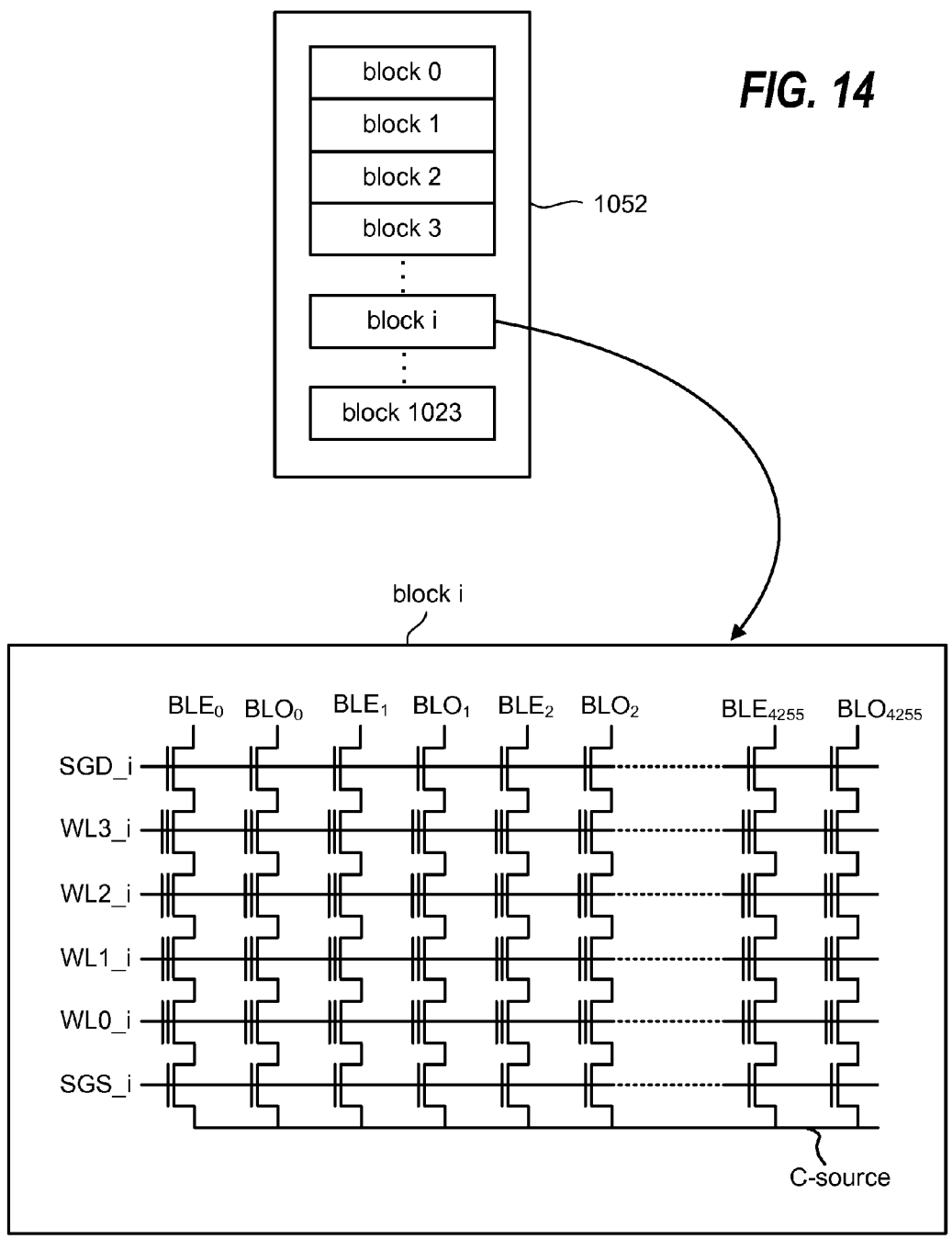
FIG. 14 depicts an example of the organization of a memory array.

FIG. 14 depicts an exemplary structure of a memory cell array 1052 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 14 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-*i*), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 15:
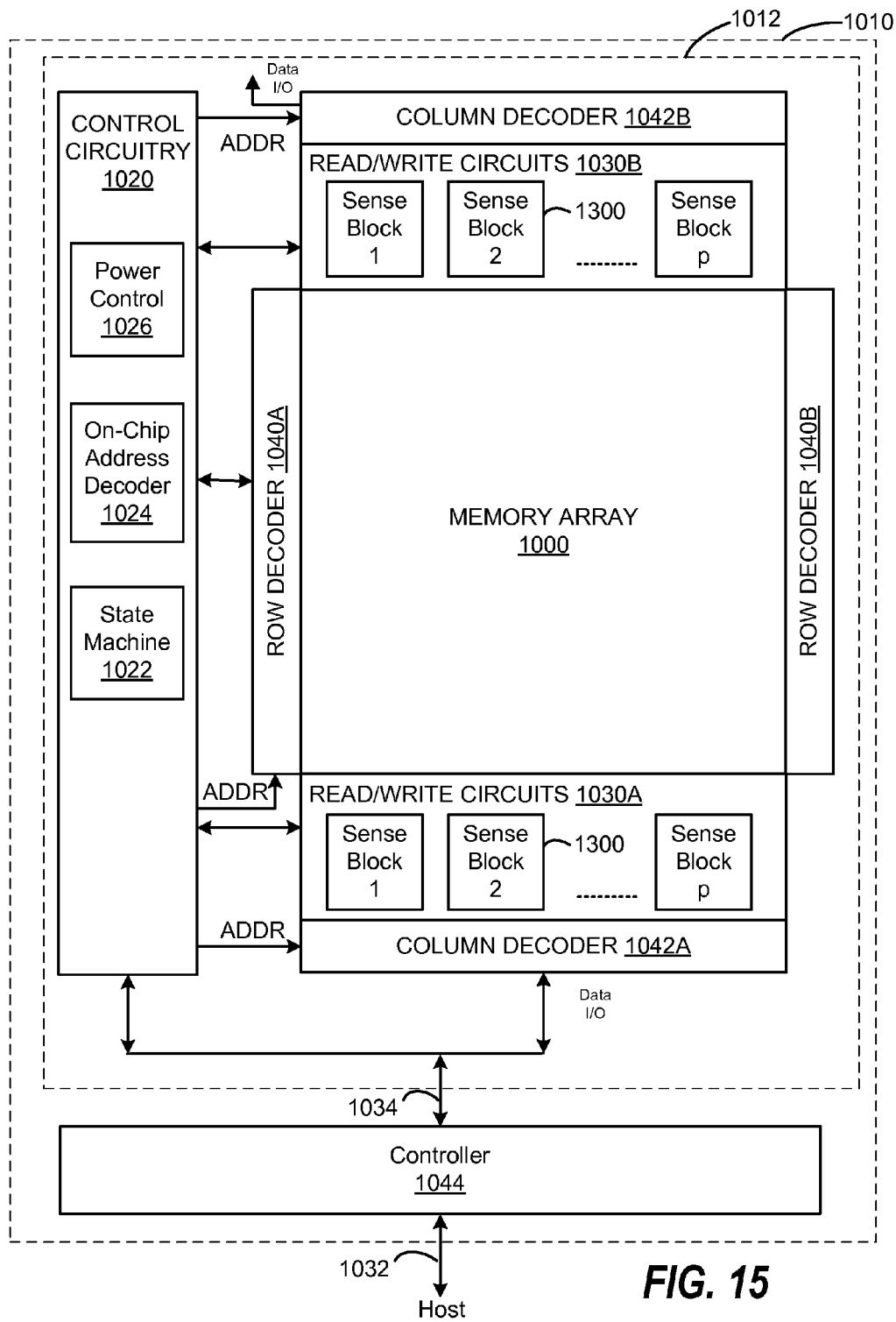
FIG. 15 is a block diagram depicting an example of a memory system.

FIG. 15 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 1300 which allow a page of memory cells to be read or programmed in parallel. The memory array 1000 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

Figure 16:
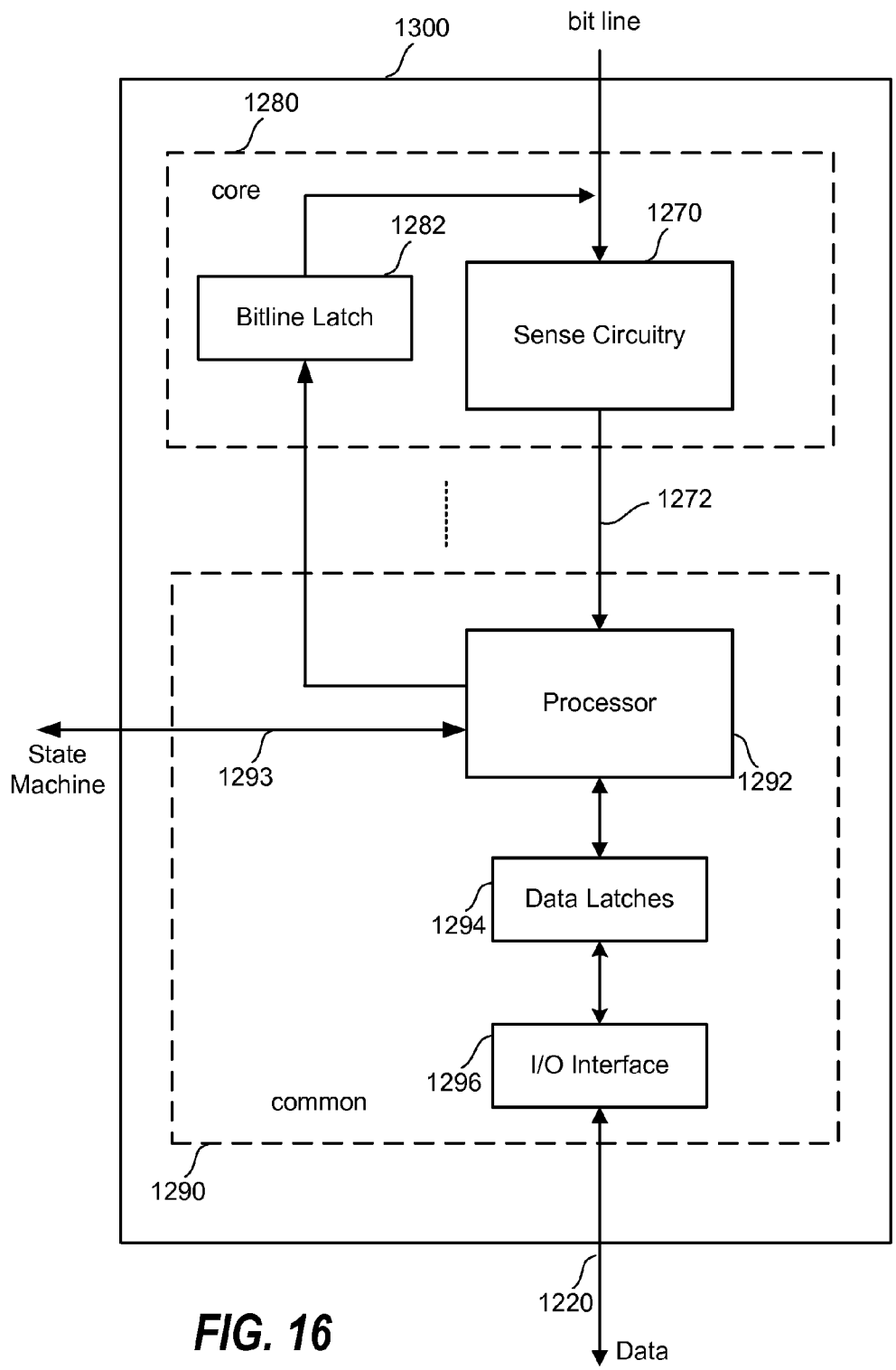
FIG. 16 is a block diagram depicting an example of a sense block.

FIG. 16 is a block diagram of an individual sense block 1300 partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details, refer to U.S. Patent Application Publication 2006/0140007, which is incorporated herein by reference in its entirety.

Sense module 1280 comprises sense circuitry 1270 that determines whether a conduction current in a connected bit line is above or below a predetermined threshold level. In some embodiments, sense module 1280 includes a circuit commonly referred to as a sense amplifier. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., Vdd).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed memory cell and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1022 that controls the supply of different control gate voltages to the addressed cell. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1292 to accumulate the results of the associated bit lines such that the state machine need only read the wired-OR line one time.

During program or verify, the data to be programmed is stored in the set of data latches 1294 from the data bus 1220. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1292 monitors the verified memory state relative to the desired memory state. When the two are in agreement, processor 1292 sets the bit line latch 1282 so as to cause the bit line to be pulled to a state designating program inhibit. This inhibits the cell coupled to the bit line from further programming even if it is subjected to programming pulses on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are 3-5 (or another number) data latches per sense module 1280. In one embodiment, the latches are each one bit. In some implementations (but not required), the data latches are implemented as a shift register so that the parallel data stored therein is converted to serial data for data bus 1220, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Various features and techniques have been presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

A non-volatile semiconductor memory in an embodiment includes a substrate and a plurality of non-volatile storage elements arranged into rows and columns above a surface of the substrate. Each non-volatile storage element includes a suspended charge storage region having a bottom surface separated from the surface of the substrate by a void. The memory includes a plurality of isolation regions formed in the substrate between a plurality of active areas of the substrate and a plurality of support pillars formed in each isolation region. The memory includes a plurality of dielectric strips including a dielectric strip formed for each row of non-volatile storage elements and a plurality of control gates including a control gate formed over each row of non-volatile storage elements. Each dielectric strip has a lower surface coupled to an upper surface of a support pillar in each isolation region, and each control gate is separated from underlying charge storage regions of the row by the dielectric strip for the row.

A non-volatile semiconductor memory in an embodiment includes a string of non-volatile storage elements that each include a suspended charge storage region having a bottom surface separated from a surface of a substrate by a void. The memory includes a dielectric material overlying the suspended charge storage region of each non-volatile storage element and a plurality of control gates extending in the row direction. Each non-volatile storage element of the string underlies one control gate of the plurality of control gates. The suspended charge storage region of each non-volatile storage element includes a first sidewall and a second sidewall extending in a row direction. The first sidewall and the second sidewall are separated from one or more adjacent suspended charge regions of the string by the void. The suspended charge storage region of each non-volatile storage element includes a third sidewall and a fourth sidewall extending in a column direction. The third sidewall and the fourth sidewall are separated from one or more suspended charge storage regions of one or more adjacent strings of non-volatile storage elements by the void.

A method of fabricating a non-volatile semiconductor memory in an embodiment includes forming a plurality of non-volatile storage elements arranged into rows and columns above a surface of a substrate. Each non-volatile storage element includes a suspended charge storage region having a bottom surface separated from the surface of the substrate by a void. The method includes etching a plurality of isolation regions into the substrate between a plurality of active areas of the substrate and forming a plurality of support pillars in each isolation region. The method includes forming a dielectric strip for each row of non-volatile storage elements. The dielectric strip has a lower surface coupled to an upper surface of a support pillar in each isolation region. The method includes forming a control gate for each row of non-volatile storage elements. The control gate for each row being separated from underlying charge storage regions of the row by the dielectric strip for the row.

A method of fabricating a non-volatile semiconductor memory in an embodiment includes forming a first layer stack column and a second layer stack column over a substrate. The first layer stack column includes a first charge storage strip separated from a surface of the substrate by a first sacrificial strip, and overlies a first active area of the substrate. The second layer stack column includes a second charge storage strip separated from the surface of the substrate by a second sacrificial strip, and overlies a second active area of the substrate. The method includes etching the substrate to define an isolation region between the first active area and the second active area, filling the isolation region with a first sacrificial spacer, a second sacrificial spacer, and a dielectric fill material, and forming an intermediate dielectric material and a control gate material. The method includes etching the control gate material, the intermediate dielectric material, the first layer stack column and the second layer stack column. Etching forms a first string of non-volatile storage elements overlying the first active area and a second string of non-volatile storage elements overlying the second active area. The first string includes a first plurality of non-volatile storage elements and the second string including a second plurality of non-volatile storage elements. Each non-volatile storage element of the first string includes a charge storage region formed from the first charge storage strip and each non-volatile storage element of the second string includes a charge storage region formed from the second charge storage strip. The method includes removing the first sacrificial spacer, the second sacrificial spacer, the first sacrificial strip, and the second sacrificial strip to form a void separating the charge storage region of each non-volatile storage element from the surface of the substrate.

A non-volatile memory array in one embodiment comprises a plurality of non-volatile storage elements arranged into rows and columns above a surface of a substrate and a plurality of isolation regions formed in the substrate between active areas of the substrate. The isolation regions extend through a cell area and select gate area of the substrate. A plurality of bit line air gaps are formed in the plurality of isolation regions. The bit line air gaps have a first vertical dimension at the cell area of the substrate and a second vertical dimension at the select gate area of the substrate, the second vertical dimension is less than the first vertical dimension.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A non-volatile semiconductor memory, comprising:
a string of non-volatile storage elements, each non-volatile storage element of the string including a suspended charge storage region having a bottom surface separated from a surface of a substrate by a void;
a dielectric material overlying the suspended charge storage region of each non-volatile storage element; and
a plurality of control gates extending in the row direction, each non-volatile storage element of the string underlying one control gate of the plurality of control gates;
wherein the suspended charge storage region of each non-volatile storage element includes a first sidewall and a second sidewall extending in a row direction, the first sidewall and the second sidewall are separated from one or more adjacent suspended charge regions of the string by the void; and
wherein the suspended charge storage region of each non-volatile storage element includes a third sidewall and a fourth sidewall extending in a column direction, the third sidewall and the fourth sidewall are separated from one or more suspended charge storage regions of one or more adjacent strings of non-volatile storage elements by the void;
wherein the void extends continuously in the column direction along the third sidewall and the fourth sidewall of each suspended charge storage region.

2. The non-volatile semiconductor memory of claim 1, wherein:
the suspended charge storage region of each non-volatile storage element is non-moveable.

3. The non-volatile semiconductor memory of claim 2, further comprising:
control circuitry for programming the non-volatile storage elements while the suspended charge storage region is separated from the surface of the substrate by the void.

4. The non-volatile semiconductor memory of claim 1, wherein:
the string of non-volatile storage elements is a first string of non-volatile storage element and is adjacent to a second string of non-volatile storage elements and a third string of non-volatile storage elements;
the third sidewall of each suspended charge storage region of the first string is separated from a fourth sidewall of an adjacent suspended charge storage region of the second string by the void; and
the fourth sidewall of each suspended charge storage region of the first string is separated from a third sidewall of an adjacent suspended charge storage region of the third string by the void.

5. Then non-volatile semiconductor memory of claim 4, wherein:
the third sidewall of each suspended charge storage region of the first string is separated from the fourth sidewall of the adjacent suspended charge storage region of the second string by the void and a dielectric trench fill material; and
the fourth sidewall of each suspended charge storage region of the first string is separated from the third sidewall of the adjacent suspended charge storage region of the third string by the void and the dielectric trench fill material.

6. The non-volatile semiconductor memory of claim 1, wherein:
the plurality of non-volatile storage elements includes a first non-volatile storage element adjacent to a first select gate, a second non-volatile storage element adjacent to a second select gate and additional non-volatile storage elements between the first non-volatile storage element and the second non-volatile storage element;
the first sidewall of the first non-volatile storage element is separated from the first select gate by the void;
the second sidewall of the second non-volatile storage element is separated from the second select gate by the void; and
the first sidewall of each additional non-volatile storage element is separated from the second sidewall of an adjacent non-volatile storage element by the void.

7. A non-volatile semiconductor memory according to claim 1, wherein:
the string of non-volatile storage elements is a first string of non-volatile storage elements; and
the non-volatile semiconductor memory includes a plurality of strings of non-volatile storage elements including the first string and the one or more adjacent strings.

8. A non-volatile semiconductor memory according to claim 7, wherein:
the dielectric material includes a plurality of strips of the dielectric material, each strip overlying one charge storage region of each string of non-volatile storage elements.

9. A non-volatile semiconductor memory according to claim 1, wherein the void includes air.

10. A non-volatile semiconductor memory according to claim 1, wherein the void is a vacuum.

11. A non-volatile semiconductor memory according to claim 1, wherein the void includes a liquid dielectric.

12. The non-volatile semiconductor memory of claim 1, further comprising:
a plurality of support pillars formed in an isolation region of the substrate, each support pillar having a first sidewall and a second sidewall extending in the column direction, the first sidewall is separated from an adjacent suspended charge storage region of the string by the void.

13. The non-volatile semiconductor memory of claim 4, further comprising:
a plurality of support pillars formed in an isolation region of the substrate, each support pillar having a first sidewall and a second sidewall extending in the column direction, the first sidewall is separated from an adjacent suspended charge storage region of the string by the void;
the third sidewall of each suspended charge storage region of the first string is separated from the first sidewall of an adjacent support pillar by the void; and
the fourth sidewall of each suspended charge storage region of the second string is separated from the second sidewall of the adjacent support pillar by the void.

14. The non-volatile semiconductor memory of claim 1, wherein:
the void extends continuously in the row direction along the first sidewall and the second sidewall of each non-volatile storage element.

* * * * *